(12) United States Patent
Jeannerot et al.

(10) Patent No.: US 12,143,081 B2
(45) Date of Patent: Nov. 12, 2024

(54) METHOD FOR INCREASING PERCEIVED LOUDNESS OF AN AUDIO DATA SIGNAL

(71) Applicant: Bang & Olufsen A/S, Struer (DK)

(72) Inventors: Alix Jeannerot, Struer (DK); Niels de Koeijer, Struer (DK); Pablo Martínez-Nuevo, Frederiksberg (DK); Martin Bo Møller, Copenhagen S (DK); Jakob Dyreby, Struer (DK)

(73) Assignee: Bang & Olufsen A/S, Struer (DK)

( * ) Notice: Subject to any disclaimer, the term of this patent is extended or adjusted under 35 U.S.C. 154(b) by 293 days.

(21) Appl. No.: 17/886,627

(22) Filed: Aug. 12, 2022

(65) Prior Publication Data
US 2023/0163739 A1    May 25, 2023

(30) Foreign Application Priority Data
Aug. 17, 2021 (DK) .............................. PA202100810

(51) Int. Cl.
*H03G 3/30* (2006.01)
*G06F 3/16* (2006.01)
*H04R 3/04* (2006.01)

(52) U.S. Cl.
CPC .......... *H03G 3/3005* (2013.01); *G06F 3/165* (2013.01); *H04R 3/04* (2013.01); *H04R 2430/01* (2013.01)

(58) Field of Classification Search
CPC ........ H03G 3/3005; G06F 3/165; H04R 3/04; H04R 2430/01
(Continued)

(56) References Cited

U.S. PATENT DOCUMENTS

| 5,481,617 A | 1/1996 | Bjerre |
| 8,538,042 B2 | 9/2013 | Yang et al. |

(Continued)

FOREIGN PATENT DOCUMENTS

| DK | 00168681 A | 10/1981 |
| WO | WO-2011/019339 A1 | 2/2011 |

OTHER PUBLICATIONS

Extended European Search Report for EP22190244.8 that claims priority to the same parent application as the instant application; dated Jan. 16, 2023, 10 pages.
(Continued)

*Primary Examiner* — David L Ton
(74) *Attorney, Agent, or Firm* — Harness, Dickey & Pierce, P.L.C.; Anthony G. Fussner

(57) ABSTRACT

Disclosed is a method for increasing a perceived loudness of an audio data signal comprising the steps of obtaining a first digital audio data signal; determining at least one temporal amplitude peak in the first digital audio data signal; generating a second digital audio data signal by reducing the at least one temporal amplitude peak in the first digital audio data signal based on a predicted perceptual difference model representing a predicted perceptual difference between the first digital audio data signal and a peak reduced version of the first digital audio data signal; and generating a third digital audio data signal by amplifying the second digital audio data signal so that a peak of the second digital audio data signal has a predetermined signal value, wherein a perceived loudness of the third digital audio data signal is larger than a perceived loudness of the first digital audio data signal.

20 Claims, 3 Drawing Sheets

(58) Field of Classification Search
USPC .......................................................... 381/56
See application file for complete search history.

(56) References Cited

U.S. PATENT DOCUMENTS

| | | | |
|---|---|---|---|
| 9,219,455 | B2 | 12/2015 | Hess et al. |
| 9,307,321 | B1 | 4/2016 | Unruh |
| 2008/0025530 | A1* | 1/2008 | Romesburg ............ H03G 7/002 381/106 |
| 2016/0211821 | A1* | 7/2016 | Grosche ................. H03G 7/002 |
| 2021/0367574 | A1* | 11/2021 | Chon ..................... H03G 7/007 |

OTHER PUBLICATIONS

Tsilfidis et al.: "Hierarchical Perceptual Mixing", In proceedings of the 126th Audio Engineering Society Convention, (2009), Munich, Germany. Paper 7789, 7 pages.

Balazs et al.: "Time-Frequency Sparsity by Removing Perceptually Irrelevant Components Using a Simple Model of Simultaneous Masking", in IEEE Transactions on Audio, Speech, and Language Processing, vol. 18, No. 1, pp. 34-49, Jan. 2010, doi: 10.1109/TASL.2009.2023164.

Pichevar et al.: "Auditory-inspired sparse representation of audio signals", Speech Communication, vol. 53, No. 5, 2011, pp. 643-657.

Jeannerot et al.: "Increasing Loudness in Audio Signals: A Perceptually Motivated Approach to Preserve Audio Quality"; Feb. 16, 2022; 5 pages.

Defraene et al.: "Real-Time perception-based clipping of audio signals using convex optimization", IEEE Transactions on Audio, Speech, and Language Processing, vol. 20, No. 10, 2012, pp. 2657-2671.

Schlecht et al.: "Audio Peak Reduction Using a Synced Allpass Filter", 2022 IEEE International Conference on Acoustics, Speech and Signal Processing (ICASSP), 2022, 5 pages.

Brunet et al.: "Nonlinear control of loudspeaker based on output flatness and trajectory planning", In proceedings of the 147th Audio Engineering Society Convention, 2019, New York, United States; 8 pages.

Schafer et al.: "The frequency selectivity of the ear as determined by masking experiments", The Journal of the Acoustical Society of America, vol. 22, No. 4, 1950, pp. 490-496.

Giannoulis et al.: "Digital dynamic range compressor design—A tutorial and analysis", Journal of the Audio Engineering Society, vol. 60, No. 6, 2012, pp. 399-408.

International Telecommunication Union: Recommendation ITU-R BS.1771-1: Requirements for loudness and true-peak indicating meters. 2012, 14 pages.

European Broadcasting Union: Recommendation R128: Loudness normalization and permitted maximum level of audio signals. 2010, 5 pages.

Fletcher et al.: "Loudness, its definition, measurement and calculation", The Bell System Technical Journal vol. 12, No. 4, 1933, pp. 377-430.

Robinson et al.: "A re-determination of the equal-loudness relations for pure tones", British Journal of Applied Physics, vol. 7, No. 5, 1956, pp. 166-181.

International Telecommunication Union: Recommendation ITU-R BS1770-2: Algorithms to measure audio program loudness and true-peak audio level, 2011, 24 pages.

Schroeder et al.: "Synthesis of low-peak-factor signals and binary sequences with low autocorrelation (Corresp.)", IEEE Transactions on Information Theory, vol. 16, No. 1, 1970, pp. 85-89.

Portnoff et al.: "Time-frequency representation of digital signals and systems based on short-time Fourier analysis", IEEE Transactions on Acoustics, Speech, and Signal Processing, vol. 28, No. 1, 1980, pp. 55-56.

Egan et al.: "On the Masking Pattern of a Simple Auditory Stimulus", The Journal of the Acoustical Society of America, vol. 22, No. 5, 1950, pp. 622-630.

Van de Par et al.: "A perceptual model for sinusoidal audio coding based on spectral integration", EURASIP Journal on Advances in Signal Processing, vol. 2005, No. 9, 2005, pp. 1-13.

Taal et al.: "A low-complexity spectro-temporal distortion measure for audio processing applications", IEEE Transactions on Audio, Speech, and Language Processing, vol. 20, No. 5, 2012, pp. 1553-1564.

Thiede et al.: "PEAQ—The ITU standard for objective measurement of perceived audio quality", Journal of the Audio Engineering Society, vol. 48, No. 1/2, 2000, pp. 3-29.

International Telecommunication Union: Recommendation ITU-R BS.1387: Method for objective measurements of perceived audio quality. 2001, 100 pages.

* cited by examiner

METHOD FOR INCREASING PERCEIVED LOUDNESS OF AN AUDIO DATA SIGNAL

CROSS-REFERENCE TO RELATED APPLICATION

This application claims the benefit of and priority to Danish Patent Application Number PA 2021 00810 filed Aug. 17, 2021. The entire disclosure of this provisional patent application is incorporated herein by reference.

TECHNICAL FIELD

The present disclosure relates to a method for increasing a perceived loudness of an audio data signal. The present disclosure further relates to a signal processing device for processing a digital audio data signal, a loudspeaker device, a computer program product, and a digital audio data signal.

BACKGROUND

This section provides background information related to the present disclosure which is not necessarily prior art.

Audio playback systems, such as stereo sets, portable loudspeakers, or the like, are commonly used to play back received audio signals. Such systems often comprise one or more amplifiers and one or more acoustic transducers for reproducing, i.e., playing back, an audio signal. Audio signals typically contain frequency components within a frequency span in the range of the human hearing, i.e., between 20 Hz and 20 kHz.

When playing back audio by means of an audio playback system, the volume, i.e., the audio playback level, can typically be adjusted so that an increased volume leads to an increased audio playback level, in turn causing the audio playback system to play back the audio signal at an increased sound pressure level. Thereby, a listener may typically perceive the audio louder, i.e., having an increased perceived loudness.

It is a general desire in audio playback systems, notably in portable loudspeakers, to provide an increased perceived loudness whilst maintaining a high perceived sound quality. Such perceived sound quality is largely determined by how faithfully and accurately low-frequency content can be reproduced.

However, in audio playback systems, increasing the volume above a certain level typically causes a less accurate reproduction of the audio signal due to physical and electrical constraints, such as system limitations in current that can be provided to the acoustic driver, over-excursion of the acoustic driver, or the like. Such less accurate reproduction may be audible in terms of spectral imbalance, i.e., severe spectral unevenness, audible harmonic and/or intermodulation distortion. Notably low-frequency content, also commonly referred to as bass, of the audio signal becomes increasing inaccurately reproduced, thereby reducing the perceived sound quality.

Traditionally, loudspeaker vent ports are used to reduce a spectral imbalance. Other signal processing techniques to linearise the low-frequency frequency response of the audio playback system have been introduced in some audio playback systems. While such techniques generally improve the frequency response of the system in the low-frequency range, these are not sufficient to avoid inaccurate bass reproduction at higher playback levels. Notably, such methods often result in trade-offs involving factors like introducing distortion and reducing loudness.

Dynamic range compressors (DRCs) are commonly used to reduce signal value, i.e., amplitude, peaks of the audio signal in the temporal domain. After applying the compressor, the signal can then be reamplified to the previous peak value. Thereby, the loud parts of the signal typically become slightly louder, whilst the quiet parts typically become much louder. This is, however, undesirable as the dynamic range of the signal thereby is reduced, thereby reducing the perceived audio quality. Furthermore, such DRCs are often not well-suited to temporally short audio signals, i.e., audio signals with a length of less than approximately 2 seconds, due to their often rather long attack and release times.

Yet other approaches rely on all-pass filters to change the phase of frequency components in the audio signal. Examples of these methods are disclosed in U.S. Pat. No. 9,307,321B1 or Schlecht et al.: *Audio Peak Reduction Using a Synced Allpass Filter* in 2022 IEEE International Conference on Acoustics, Speech, and Signal Processing (ICASSP), 2022. Such methods often rely on configuring the all-pass filters to provide a peak reduction. The all-pass filters are typically adjusted ad-hoc to provide reasonable peak reduction for different signals or signal components. In these methods, the perceptual quality of the peak reduction is typically indirectly controlled, e.g., through parameter choices for the filters.

It therefore remains a problem to provide a method for improving the perceived loudness of an audio data signal, such as an audio signal, which overcomes at least some of the abovementioned drawbacks. It is furthermore desired to improve the perceived loudness while allowing for a high perceived audio quality.

SUMMARY

According to a first aspect, the present disclosure relates to a method for increasing a perceived loudness of an audio data signal comprising the steps of:
  obtaining a first digital audio data signal;
  determining at least one temporal amplitude peak in the first digital audio data signal;
  generating a second digital audio data signal by reducing the at least one temporal amplitude peak in the first digital audio data signal based on a predicted perceptual difference model representing a predicted perceptual difference between the first digital audio data signal and a peak reduced version of the first digital audio data signal; and
  generating a third digital audio data signal by amplifying the second digital audio data signal so that a peak of the second digital audio data signal has a predetermined signal value, wherein a perceived loudness of the third digital audio data signal is larger than a perceived loudness of the first digital audio data signal.

By using a predicted perceptual difference between the first digital audio data signal and the peak reduced version of the first digital audio data signal, it has been realised that a second digital audio data signal can be generated based on reducing a signal peak in the first digital audio data signal with only an acceptable amount of, if any, perceived perceptual difference to the listener. Thereby, the second digital audio data signal may be generated to provide a smaller crest factor, i.e., a ratio between peak value and RMS value, than a corresponding first digital audio data signal. By, in combination, amplifying the second digital audio data signal, an increased perceived loudness may be provided with an increased sound quality compared to traditional clipping or compressing. Notably, the perceived loudness may be increased for both "louder" and "quieter" signal parts, i.e., parts with relatively high signal power and parts with relatively low signal power.

Moreover, it has been found that by reducing the at least one temporal amplitude peak in the first digital audio data signal based on a predicted perceptual difference model, a signal fulfilling the requirements to desired peak reduction and sound quality may be determined, e.g., by means of optimisation and/or non-linear operations. Thereby, an improved peak reduction providing a sufficient sound quality (i.e., sufficiently small predicted perceptual difference) may be provided, as the peak reduction may not be subject to filter constraints or limitations. Hence, a second digital audio data signal may be provided allowing for a reduced temporal amplitude peak and a sufficiently low predicted perceptual difference, in turn providing a third digital audio data signal allowing for an improved perceived loudness and a sufficiently low predicted perceptual difference.

Furthermore, by determining the predicted perceptual difference and generating the second digital audio data signal based thereon, a short signal processing time may be provided, in turn, allowing for the method to be used in time critical applications, such as in real-time (or near real-time) audio playback.

By the perceived loudness of the third digital audio data signal being larger than the first digital audio data signal, it may be understood that the third audio data signal may be perceived by a user as being louder when the third digital audio data signal is used in playback than when the first digital audio data signal is used in playback within the same constraints. Throughout this disclosure, it will be appreciated that the term increased perceived loudness results in the user perceiving the third digital audio data signal louder when used in playback than when the first digital audio data signal is used in playback, i.e. perceived louder than a corresponding version of the first digital audio data signal when used in playback using the same amplification level at the same audio playback system.

Alternatively, or additionally, a signal energy of the third digital audio data signal may be larger than a signal energy of a corresponding version of the first digital audio data signal. For instance, where both the third digital audio data signal and the first digital audio data signal are digital audio signals, the signal energy of the third digital audio data signal may be larger than a signal energy of the first digital audio data signal. By the energy being larger may herein be understood that a signal energy and/or an RMS value of the one signal is larger than a signal energy and/or an RMS value of the other signal.

In some embodiments, the third digital audio data signal has a lower crest factor than the first digital audio data signal. Alternatively, or additionally, the difference between an amplitude peak value and a root mean square (RMS) value may be lower for the third signal than a difference between an amplitude peak value and an RMS value of the first signal.

The method may be a computer-implemented method. Alternatively, or additionally, the method may be performed in and/or implemented in a signal processing device. The signal processing device may be or may comprise one or more of a digital signal processor (DSP), a central processing unit (CPU), a micro-controller unit (MCU), or the like. The signal processing device may further comprise memory for storing instructions causing the signal processing device to perform the method.

Predicted perceptual difference models, such as predicted perceptual models for frequency masking are well-known and commonly used in the field of audio encoding. In audio encoding and decoding, such models are used to efficiently reduce the number of components to be encoded and thereby reduce the file size of the encoded audio.

A predicted perceptual difference may be and/or may comprise audible artefacts resulting from a peak reduction. Such audible artefacts may comprise distortion, such as harmonic distortion and/or intermodulation distortion. The predicted perceptual difference may, correspondingly, be and/or comprise artefacts audible to the human ear.

By a digital signal may herein be understood a series of data points comprising a plurality of data points. A digital signal may have a first sample length. The first sample length may be at least two or more. The series of data points may be a time series of data points sampled at a predetermined sample interval or with a predetermined sample frequency. A digital signal may, thus, be a sampled analogue signal.

It will furthermore be understood that a digital audio signal is a signal representing sound, synthesized in, or recorded into digital form and/or recorded in an analogue form and converted into digital form. For instance, some audio signals are sampled by a sample frequency of 44,100 Hz. A digital audio signal may, for instance, be an audio signal sampled at 44.1 kHz and having a sample length.

By a "temporal amplitude peak" may herein be understood an amplitude peak in the digital audio data signal represented in the time domain, such as a discrete time domain. The temporal amplitude peak may be a peak signal value, such as a maximum absolute signal value. Alternatively, or additionally, the temporal amplitude peak may be values of one or more samples, such as one or more consecutive samples, including a maximum absolute signal value of the first digital audio data signal.

A temporal amplitude peak of a signal, such as the first digital audio data signal, may in some embodiments be reduced by changing an amplitude and one or more phases of the signal. Changing the amplitude and or more phases of the signal may be or comprise changing an amplitude and one or more phases of a spectrum of the signal and/or of one or more spectral components, such as one or more frequency components or frequency bins, of the spectrum of the signal. The amplitude and/or the one or more phases may be changed non-linearly.

In some embodiments, the third digital audio data is obtained by normalising the second digital audio data signal to a predetermined signal value. Alternatively, or additionally, a gain, such as a linear or a non-linear gain, may be applied to the signal. In some embodiments, the gain may be applied to the entire third digital audio data signal. The gain may, alternatively or additionally be a gain factor. The gain factor may be larger than 1.

The predetermined signal value may be the value of the peak of the first digital audio data signal. The third digital audio data signal may have a peak value, which is similar to or identical to that of the first digital audio data signal, albeit with an increased perceived loudness and/or an increased energy and/or RMS signal value. Alternatively, or additionally, the predetermined signal value may be a value, which is based on a limit of a current of an amplifier, based on a limit of a voltage of an amplifier, based on a predetermined maximum driver excursion, or based on a limit of the audio data signal.

The predicted perceptual difference model may be a model for determining a predicted perceptual difference between at least two signals. The predicted perceptual difference model may be a model, which relies on models of the human hearing. In some embodiments, the predicted perceptual difference model takes auditory masking, such as spectral masking and/or temporal masking into account.

The predicted perceptual difference model may take into account an amplifier voltage, an amplifier current, a driver excursion, and/or a sound pressure level, which a digital audio signal may cause when played back by a loudspeaker using an amplifier. Correspondingly, the predicted perceptual difference model may take into account settings of a pre-amplifier, a power amplifier, and/or specifications, such as a resistance (e.g., Re), voice coil inductance (Le), compliance (e.g., Cms), Q parameters, a Bl parameter, or the like, of a driver.

The predicted perceptual difference model may use one or more linear transforms to transform a digital audio data signal into an estimated acoustic driver voltage and/or acoustic driver current or vice versa. The predicted perceptual difference model may alternatively or additionally rely on linear transforms to transform between a signal indicative of an acoustic driver voltage and/or current and an estimated driver excursion, which may potentially be transformed further into an estimated sound pressure generated by the driver by means of one or more linear transforms and vice versa.

The predicted perceptual difference model may in some embodiments comprise an amplifier model and/or a loudspeaker model.

Where the predicted perceptual difference model comprises a loudspeaker model, the loudspeaker model may be a model which stores the previous state of the loudspeaker driver, i.e., it predicts the new excursion based on where it currently is rather than assuming the loudspeaker driver is at the rest position. Alternatively, or additionally, the model may be based on a current active sensing of a state of the loudspeaker driver.

Generating the second digital audio data signal may comprise reducing the temporal peak of the first digital audio data signal based on the predicted perceptual difference and selecting as the second digital audio data signal a peak-reduced version of the first digital audio data signal. Alternatively, generating the second digital audio data signal may comprise determining a second audio data signal based on a peak-reduced version of the first digital audio data signal. In some embodiments, the second audio data signal may be determined by applying a transform operation to the peak reduced version of the first digital audio signal, potentially to transfer the peak reduced version of the first digital audio signal into a corresponding digital audio signal, and selecting as the second digital audio data signal the transformed peak-reduced version of the first digital audio data signal. For instance, where the first digital audio data signal is not an audio signal, a transform may be applied to the peak-reduced version to generate the second digital audio data signal as an audio signal resulting in the peak-reduced version of the first audio data signal when played back.

Alternatively, or additionally, the second audio data signal may be generated based on the peak-reduced version of the first digital audio data signal, wherein the peak-reduced version of the first audio data signal is generated by reducing the at least one temporal amplitude peak of the first digital audio data signal based on the predicted perceptual difference. Reducing the at least one temporal amplitude peak may alternatively be referred to as "peak-reducing" the first digital audio data signal.

The peak-reduced version of the first digital audio data signal and/or the second digital audio data signal may comprise peaks at different points in time (i.e., different samples), potentially having a different value than corresponding samples of the first digital audio data signal. In some embodiments, the amplitude of any temporal amplitude peak in the peak-reduced version of the first digital audio data signal and/or a corresponding version of the second digital audio data signal has an amplitude lower than the amplitude of the at least one temporal amplitude peak of the first digital audio data signal.

The step of generating the second audio data signal may, alternatively or additionally, comprise further signal processing steps.

In one example, where the first digital audio data signal is a digital audio signal, the predicted perceptual difference model may determine a predicted perceptual difference between the first digital audio data signal and a peak reduced version of the first digital audio data signal. The second digital audio data signal may be the peak reduced first digital audio data signal. The predetermined value, to which the second digital audio data signal is amplified to generate the third digital audio data signal, may be a limit of the digital audio data signal and/or a predetermined threshold value. In other examples, the predicted perceptual difference model may, e.g. by means of linear transforms, determine an estimated sound pressure, which would have resulted from applying the first digital audio data signal to a loudspeaker device and estimate a predicted perceptual difference between a sound pressure caused by a peak reduced version of the first digital audio data signal and the sound pressure caused by the first digital audio data signal.

In another example, the first digital audio data signal may be a digital signal representative of an acoustic driver voltage or an acoustic driver current. In this example, the predicted perceptual difference model may apply transforms, such as linear transforms, to determine a predicted perceptual difference based on an estimated sound pressure caused by the first digital audio data signal representative of an acoustic driver voltage/current and a peak reduced version of the first digital audio data signal representative of an acoustic driver current/voltage. In other examples, the predicted perceptual difference model may apply a transform to obtain an estimated digital audio signal, which when applied results in the first digital audio data signal. In this example, the predicted perceptual difference model may determine a predicted perceptual difference based on the estimated digital audio signal and an estimated digital audio signal resulting in the peak reduced version of the first digital audio data signal.

In yet another example, the first digital audio data signal may be representative of a driver excursion of an acoustic driver. In this example, the predicted perceptual difference model may apply transforms, such as linear transforms, to determine an estimated sound pressure resulting from the driver excursion and determine a predicted perceptual difference based on the estimated sound pressure caused by the first digital audio data signal representative of the driver excursion and a sound pressure caused by a peak reduced version of the first digital audio data signal representative of a driver excursion. In other examples, the predicted perceptual difference model may apply a transform to obtain an estimated digital audio signal, which when applied results in the first digital audio data signal. In this example, the predicted perceptual difference model may determine a predicted perceptual difference based on the estimated digital audio signal and an estimated digital audio signal resulting in the peak reduced version of the first digital audio data signal.

In some embodiments, obtaining the first digital audio data signal comprises receiving a first digital audio signal and determining, based on the first digital audio signal, a first digital audio data signal, wherein the first digital audio data signal is and/or comprises one or more of the first digital audio signal, a signal representative of an estimated amplifier current of an audio playback system when playing back the first digital audio signal, a signal representative of an estimated amplifier voltage of an audio playback system playing back the first digital audio signal, and a signal representative of an estimated driver excursion of a driver of an audio playback system when playing back the first digital audio signal. The first digital audio data signal may be obtained by applying a corresponding model or transform, for instance any model and/or transform described with respect to the predicted perceptual difference model. Alternatively, or additionally, obtaining the first digital audio data signal may comprise selecting a predetermined number of consecutive samples of the first digital audio data signal or first digital audio signal, where a such is received, to determine a first digital audio data signal having a first sample length. The predetermined number of consecutive samples may be obtained by applying a window function to the first digital audio data signal or first digital audio signal, where a such is received. The third digital audio data signal may be a digital audio signal and a perceived loudness of the third digital audio data signal may be larger than a perceived loudness of the first digital audio signal.

Where the first digital audio data signal is and/or comprises a signal indicative of one or more of the estimated amplifier current, estimated amplifier voltage, and the estimated driver excursion, the estimated amplifier current, amplifier voltage, and/or driver excursion may be estimated for a current or predetermined amplifier (volume) setting of the audio playback system. The method may further comprise, potentially prior to determining the first digital audio data signal, obtaining a current amplifier setting of the audio playback system.

In some embodiments, the first digital audio data signal comprises one or more of a digital audio signal, a digital signal representative of an acoustic driver current, a digital signal representative of an acoustic driver voltage, a digital signal representative of an excursion of an acoustic driver, and a digital signal representative of a sound pressure when the signal is played back via an acoustic driver.

Alternatively, the first digital audio data signal is a digital audio signal, a digital signal representative of an acoustic driver current, a digital signal representative of an acoustic driver voltage, a digital signal representative of an excursion of an acoustic driver, or a digital signal representative of a sound pressure when the signal is played back via an acoustic driver.

Thereby, a peak may be reduced in various types of signals, so as to take different system limitations into account.

The first digital audio data signal representative of a sound pressure when the signal is played back via an acoustic driver may be determined based on a transform, such as a linear transform, of a digital signal representative of an excursion of the acoustic driver. The excursion may be determined based on a model of the acoustic driver taking into account parameters of the acoustic driver.

By a digital signal representative of an acoustic driver current may throughout this disclosure be understood a digital signal indicative of a current provided to an acoustic driver by an amplifier in response to receiving an audio signal. Correspondingly, a digital signal representative of an acoustic driver current may alternatively be denoted a digital signal indicative of an amplifier current, i.e., an output current of the amplifier.

Similarly, by a digital signal representative of an acoustic driver voltage may throughout this disclosure be understood a digital signal indicative of a voltage provided to an acoustic driver by an amplifier in response to receiving an audio signal. Correspondingly, a digital signal representative of an acoustic driver voltage may alternatively be denoted a digital signal indicative of an amplifier voltage, i.e., an output voltage of the amplifier.

In some embodiments, the second and third digital audio data signals are digital audio signals. A digital audio signal may comprise a plurality of samples corresponding to a sample length above 1.

Alternatively, the second and/or third digital audio data signals may be or each comprise one or more of a digital audio signal, a digital signal representative of an acoustic driver current, a digital signal representative of an acoustic driver voltage, and a digital signal representative of an excursion of an acoustic driver, and a digital signal representative of a sound pressure when the signal is played back via an acoustic driver.

In some embodiments, the first digital audio data signal may comprise a plurality of signals from a group of types of signals comprising a digital audio signal, a digital signal representative of an acoustic driver current, a digital signal representative of an acoustic driver voltage, a digital signal representative of an excursion of an acoustic driver, or a digital signal representative of a sound pressure when the signal is played back via an acoustic driver. Each signal potentially comprised by the first digital audio data signal may be of a different type. Alternatively, or additionally, the method may comprise obtaining a plurality of first digital audio signals, each of the plurality of first digital audio signals potentially being of a different type.

Where a plurality of first digital audio data signals is provided or where the first digital audio data signals comprise a plurality of signals, the second digital audio data signal may be generated by reducing the at least one temporal amplitude peak in each of the first digital audio data signals based on a predicted perceptual difference model representing a predicted perceptual difference between each of the first digital audio data signals and a peak reduced version of the respective first digital audio data signals. As an example, the second digital audio data signal may be generated as a digital audio signal, which corresponds to a peak reduced version of one or more of the plurality of first digital audio data signals.

As another example, a first digital audio data signal representing an amplifier current and a first digital audio data signal representing a driver excursion is obtained. In this example, the second digital audio data signal may be a second digital audio signal, which is generated so that this will result in a corresponding amplifier current having a reduced peak and a driver excursion having a reduced peak when compared to the respective first digital audio data signals.

Throughout the disclosure, it will be appreciated where one signal is compared to a "corresponding version of another signal", this refers to comparing the signals in the same domain, i.e., as inter alia audio signals, signals indicative of current/voltage, driver excursion, or sound pressure, respectively. Thus, in an example where the third digital audio signal is a digital audio signal and is compared to the first digital audio data signal, a corresponding version of the first digital audio data signal refers to an audio signal based on the first digital audio data signal, obtainable by means of transforms and/or models as described in the preceding and the following.

In some embodiments, the step of generating the second digital audio data signal based on the predicted perceptual difference model comprises reducing the at least one temporal amplitude peak of the first digital audio data signal so that the predicted perceptual difference between the first digital audio data signal and the peak reduced version of the first digital audio data signal is less than or equal to a predetermined threshold value.

Thereby, the temporal amplitude peak(s) may be reduced only to a level at which the audible artefacts (i.e., the predicted perceptual difference) are below a certain level. Hence, a peak reduction may be provided only to a perceptually acceptable degree. Thereby, an improved loudness with limited if any audible artefacts may be provided.

The predicted perceptual difference may be represented by a value indicating the amount of audible artefacts. For instance, a such value may be on a scale from 0 to 1, where 1 represents large amounts of audible artefacts, such as distortion, and 0 indicates that the first digital audio data signal and the peak reduced version thereof are identical and/or are perceived identical.

The second digital audio data signal may be generated based on solving an optimisation problem. The optimisation problem to be solved may be to minimise a maximum amplitude of the first digital audio data signal so that a predicted perceptual difference between a peak reduced version of the first digital audio data signal and the first digital audio data signal is less than or equal to the predetermined threshold value.

In an example, there is provided an input signal x, a processed signal $\tilde{x}$, and a perceptual model $P\{x-\tilde{x}\}$ which predicts the perceptual detectability of the difference between signals x and $\tilde{x}$. Furthermore, there is provided a model (potentially implemented as a transform) predicting the loudspeaker driver excursion due to the processed signal $\tilde{x}$, $L\{\tilde{x}\}$. The curly brackets are used here to indicate that $P\{\ \}$ and $L\{\ \}$ may be models, which may be linear transformations and/or may comprise other operations, such as non-linear operations.

With the above definitions, the processed signal $\tilde{x}$ which minimizes the loudspeaker excursion, subject to the constraint that the perceptual difference between x and $\tilde{x}$ is below a predefined threshold is determined by solving the following optimization problem:

$$\min_{\tilde{x}} \max|L\{\tilde{x}\}| \quad (1)$$

$$\text{such that: } \|P\{x-\tilde{x}\}\|_{2_2}^2 \le c$$

Wherein c denotes a predetermined perceptual constant indicative of a threshold for perceived perceptual difference between the two signals, x and $\tilde{x}$.

Alternatively, the optimisation problem may be to minimize the perceptual difference between x and $\tilde{x}$, subject to the loudspeaker excursion being below a predefined threshold, i.e.:

$$\min_{\tilde{x}} \|P\{x-\tilde{x}\}\|_{2_2}^2 \quad (2)$$

$$\text{such that: } \max|L\{\tilde{x}\}| \le k$$

Wherein k denotes a threshold driver excursion.

The processed signal $\tilde{x}$ may be amplified so that a peak thereof has a predetermined and/or may be normalised.

While described here based on a predicted driver excursion, it will be appreciated that the above optimisation problems may equally be based on signals indicative of an amplifier voltage, amplifier current, sound pressure, and/or the digital audio signal by applying the respective appropriate model or transform instead of the loudspeaker driver excursion predicting model or transform.

In some embodiments, the step of generating the second digital audio data signal based on the predicted perceptual difference model comprises selecting a peak reduced version of the first digital audio data signal from a plurality of peak reduced versions of the first digital audio data signal based on the predicted perceptual difference between the first digital audio data signal and each of the peak reduced versions of the first digital audio data signal, wherein the at least one temporal amplitude peak of each of the plurality of peak reduced versions of the first digital audio data signal has been reduced to be less than or equal to a predetermined signal threshold value.

Thereby, the digital audio data signal may be limited to be within a certain limit, such as within an excursion threshold value, a driver current or voltage threshold value, or an audio signal threshold value. By determining the second digital audio data signal based on selecting the peak reduced version of the first digital audio data signal from the plurality of peak reduced versions, the second digital audio data signal may be determined as the peak reduced version from the plurality of peak reduced versions, which yields the lowest predicted perceptual difference. Thus, the digital audio data signal may be limited to be within a predetermined signal value range so that an as low as possible perceptual difference is introduced.

The second digital audio data signal may be generated by means of solving an optimisation problem. The optimisation problem may be to minimise a predicted perceptual difference so that a temporal peak (i.e., an absolute maximum) of the first digital audio data signal is below or equal to a predetermined threshold value.

In some embodiments, the predicted perceptual difference model comprises a masking model, such as a masking matrix, representative of a perceptual weight of frequencies in an audio data signal, and wherein the method further comprises obtaining the masking model.

Thereby, at least the frequency masked components in the signal may easily be determined by applying the masking model to the signal.

Where the masking model is and/or comprises a masking matrix, the masking matrix may have a length and/or width corresponding to a sample length of the first digital audio data signal. In some embodiments, the masking matrix is a diagonal matrix having a length and a width of the same length as the sample length of the first digital audio data signal, potentially wherein each value corresponds to a perceptual weight of each frequency.

In some embodiments, the method may further comprise the step of obtaining the masking model by determining the masking model based on the first digital audio data signal.

For instance, the masking model may be obtained by processing the first digital audio data signal and a perceptual model modelling the human perception of sound together.

The first digital audio data signal may be used to determine the masking, such as the temporal and/or spectral masking, of one or more temporal components and/or frequency components of an audio data signal.

In some embodiments, the predetermined threshold is a predetermined threshold value, and the second digital audio data signal is generated based on a peak reduced version of the first digital audio data signal so that a weighted spectral difference between the first digital audio data signal and the peak reduced version of the first digital audio data signal is less than or equal to the predetermined threshold value.

Thereby, the second digital audio data signal may correspond to a peak reduction of the first digital audio data signal only to a certain, predetermined level of audible artefacts.

The predetermined threshold value may be provided based on empirical data and/or may be predetermined.

In some embodiments, the second digital audio data is generated by minimising the at least one temporal peak of the first digital audio data signal based on the predicted perceptual difference between the peak-reduced version of the first digital audio data signal and the first digital audio data signal being less than or equal to a predetermined threshold value.

Thereby, the second digital audio data signal may correspond to a peak-minimised version of the first digital audio data signal providing a sufficient audio quality, i.e., the version of the first digital audio having the lowest peak whilst having an acceptable perceptual difference.

By minimising the temporal peak(s) of the first digital audio data signal on the predicted perceptual difference may be understood that a first digital audio data signal having a lowest peak(s) within the constraint that the perceptual difference between the peak-reduced version and the first digital audio data signal does not exceed the predetermined threshold value.

The minimisation may be performed by solving an optimisation problem. The optimisation problem may be to minimise a peak of the first digital audio data signal so that the predicted perceptual difference between the peak-reduced version of the first digital audio data signal and the first digital audio data signal is less than or equal to the predetermined threshold value.

In some embodiments, the first digital audio data signal is sampled by a first sampling rate and, wherein the method further comprises, after receiving the first digital audio data signal and prior to generating the second digital audio data signal, down-sampling the first digital audio data signal by a second sampling rate, the second sampling rate being lower than the first sampling rate.

Thereby, fewer samples may need to be processed during the peak reduction and, notably, when determining the predicted perceptual difference. This, in turn, allows for a reduced processing time.

The step of generating the second digital audio data signal may comprise upsampling a peak-reduced version of the first digital audio data signal and/or the second digital audio data signal to have the first sampling rate.

In some embodiments, the method further comprises outputting the third digital audio data signal to an audio pre-amplifier, an audio power-amplifier, or a cross-over network.

In some embodiments, the method further comprises, prior to determining the temporal peak and generating the second digital signal, applying a low-pass and/or band-pass filter to the first digital audio data signal.

Thereby, only frequency components, such as low-frequency components which in some cases have the largest influence on certain signal amplitude peaks, may be taken into account when generating the second digital audio data signal. Thereby, a lower sampling rate may, correspondingly, be required (according to Nyquist's theorem), allowing for a low processing time.

Generating the second digital audio data signal may comprise concatenating a peak-reduced version of the low-pass filtered first digital audio data signal and high-frequency components of the first digital audio data signal so as to generate a second digital audio data signal comprising signal components over a substantially entire or entire frequency range of the first digital audio data signal.

In some embodiments, the applying a band-pass filter comprises applying a filter-bank comprising a plurality of bandpass filters to the first digital audio data signal to generate a plurality of band-pass filtered versions of the first digital audio data signal, wherein the temporal peak(s) is/are determined in one or more of the plurality of band-pass filtered versions of the first digital audio data signal, and wherein the second digital audio data signal is generated by reducing a peak in the one or more of the plurality of band-pass filtered versions of the first digital audio data signal.

The second digital audio data signal may be generated based on a peak-reduced version of the one or more of the plurality of band-pass filtered versions of the first digital audio data signal.

The second digital audio data signal may be generated by merging or concatenating peak-reduced versions of the one or more of the plurality of band-pass filter versions of the first digital audio data signal or transformations thereof into a respective corresponding digital audio signal.

The one or more of the plurality of band-pass filtered versions of the first digital audio data signal may be a subset of the plurality of band-pass filtered versions. The second digital audio data signal may be generated by merging or concatenating peak-reduced versions of the one or more of the plurality of band-pass filtered versions of the first digital audio data signal or transformations thereof into a respective corresponding digital audio signal with the remaining band-pass filtered versions of the plurality of band-pass filtered versions, i.e. with the one or more of the plurality of band-pass filtered versions excluded from the subset.

In an example, a four-band filter-bank is applied to the first digital audio data signal representing an amplifier current generating four band-pass filtered versions of the first digital audio data signal. In this example, peaks are detected in two band-pass filtered versions of the first digital audio data signal. The second digital audio data signal is then generated by reducing the peak in both of these two band-pass filtered versions, transforming these into respective audio data signals, and concatenating these audio data signals (e.g., by means of summation) with corresponding transforms of the remaining two band-pass filtered versions, in which peaks have not been detected. Thereby, the second digital audio data signal in the form of a digital audio signal is generated.

It will, however, be appreciated that any number of band-pass filters may be used, and that the steps may be performed without applying transforms or that concatenation may be performed prior to transforming into a digital audio file.

In some embodiments, the second audio data signal may be generated based on processing the low- and/or band-passed first digital audio data signal in one or more of the frequency bands so that a combined signal, resulting from the low- and/or band-passed signal in each band being combined or concatenated after processing in the one or more bands, has a reduced peak. The processing may be based on a predicted perceptual difference between the combined signal and the first digital audio data signal. The first audio data signal may be processed in the one or more frequency bands so that the combined signal has a peak value below a predetermined threshold value with a lowest possible predicted perceptual difference relative to the first audio data signal or a predicted perceptual difference relative to the first audio data signal below a predetermined threshold and a lowest possible peak value. The low-passed and/or band-passed first digital audio data signal may be down-sampled prior to processing in one or more of the frequency bands. After processing, the one or more processed down-sampled and filtered frequency bands of the first audio data signal may be up-sampled and subsequently combined or concatenated with the remaining frequency bands to generate the combined signal. In other words, certain frequency bands of the first digital audio data signal may be down-sampled and processed so that the certain frequency bands, subsequently up-sampled and combined with the remaining frequency bands, result in a peak-reduced version of the first digital audio data signal based on the predicted perceptual difference between the peak-reduced version and the first digital audio data signal.

A second aspect of the present disclosure relates to a signal processing device for processing a digital audio data signal comprising a processing unit configured to perform the method according to the first aspect.

The signal processing device may provide identical or similar advantages to the method of the first aspect of this disclosure. Embodiments of the signal processing device may be the same as described with respect to the method according to the first aspect of this disclosure.

A third aspect of the present disclosure relates to a loudspeaker device comprising the signal processing device according to the second aspect, wherein the loudspeaker device further comprises a loudspeaker driver and an amplification arrangement connected to the loudspeaker driver and the signal processing device, the amplification arrangement being configured to provide an audio signal to the loudspeaker driver, and wherein the signal processing device is configured to output the second digital audio data signal to the amplification arrangement.

The loudspeaker device may provide identical or similar advantages to the method of the first aspect of this disclosure. Embodiments of the loudspeaker device may be the same as described with respect to the method according to the first aspect of this disclosure.

In some embodiments, the loudspeaker device further comprises a battery for powering at least the signal processing device and the amplification arrangement.

A fourth aspect of the present disclosure relates to a computer program product comprising program code means adapted to cause a data processing system to perform the steps of the method according to any one of claims 1-12, when the program code means are executed on the data processing system.

The computer program product may provide identical or similar advantages to the method of the first aspect of this disclosure. Embodiments of the computer program product may be the same as described with respect to the method according to the first aspect of this disclosure.

The data processing system may be and/or may comprise a signal processing device, potentially comprising a memory and a processing unit.

In some embodiments, the computer program product comprises a non-transitory computer-readable medium having stored thereon the program code means.

A fifth aspect relates to a digital audio data signal generated using the method according to the first aspect.

The digital audio data signal may provide identical or similar advantages to the method of the first aspect of this disclosure. Embodiments of the digital audio data signal may be the same as described with respect to the method according to the first aspect of this disclosure.

A person skilled in the art will appreciate that any one or more of the above aspects of this disclosure and embodiments thereof may be combined with any one or more of the other aspects of the disclosure and embodiments thereof.

BRIEF DESCRIPTION OF DRAWINGS

The method and the signal processing unit will now be described in greater detail based on non-limiting exemplary embodiments and with reference to the drawings, on which.

Similar reference numerals are used for similar elements across the various embodiments and figures described herein.

DETAILED DESCRIPTION

The detailed description that follows describes exemplary embodiments and the features disclosed are not intended to be limited to the expressly disclosed combination(s). Therefore, unless otherwise noted, features disclosed herein may be combined together to form additional combinations that were not otherwise shown for purposes of brevity.

Figure 1:
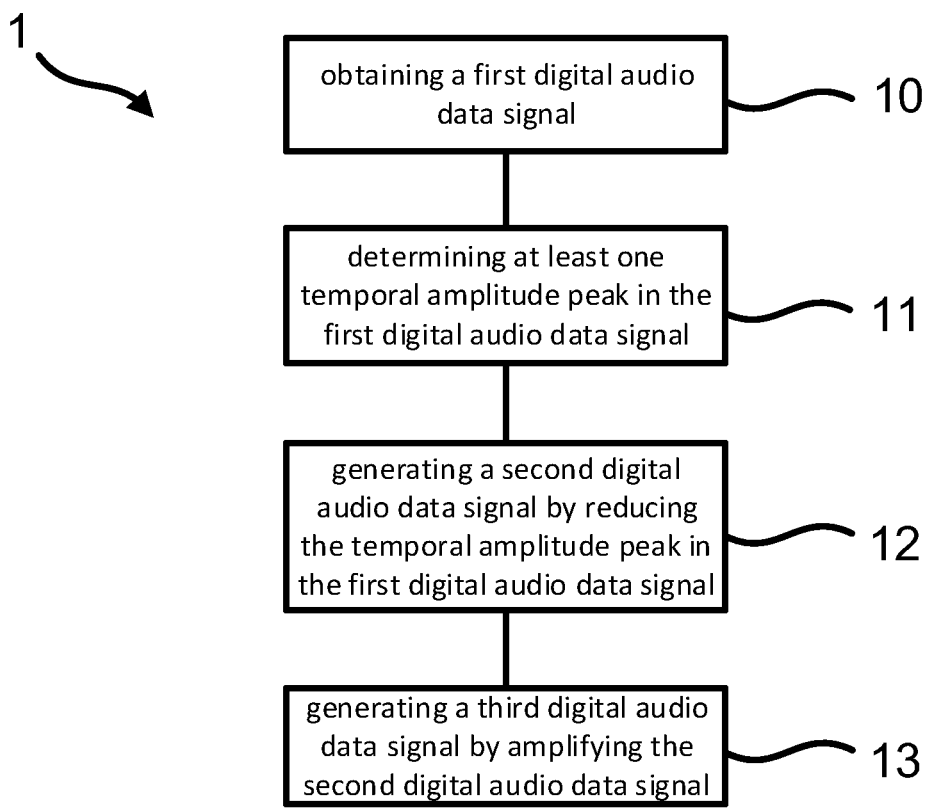
FIG. 1 shows an exemplary flow chart of an embodiment of a method according to the present disclosure.

FIG. 1 shows an exemplary flow chart of an embodiment of a method 1 for increasing a perceived loudness of an audio data signal according to the present disclosure.

The method 1 comprises obtaining 10 a first digital audio data signal;

determining 11 at least one temporal amplitude peak in the first digital audio data signal;

generating 12 a second digital audio data signal by reducing the at least one temporal amplitude peak in the first digital audio data signal based on a predicted perceptual difference model representing a predicted perceptual difference between the first digital audio data signal and a peak reduced version of the first digital audio data signal; and generating 13 a third digital audio data signal by amplifying the second digital audio data signal so that a peak of the second digital audio data signal has a predetermined signal value, wherein a perceived loudness of the third digital audio data signal is larger than a perceived loudness of the first digital audio data signal.

The method 1 may be implemented in or by a signal processing device, such as a DSP or the like.

In some embodiments, the obtaining 10 comprises receiving a first digital audio signal and based on the first digital audio signal, determine a first digital audio data signal, the first digital audio data signal being representative of one or more of the first digital audio signal, an amplifier current, an amplifier voltage, a driver excursion, and a sound pressure. The first digital audio data signal may be obtained by a performing a transform, such as a linear transform, of the first digital audio signal to determine the first digital audio signal (i.e. the linear transform corresponds to a unity transform into the same domain), an amplifier current caused by playing back the first digital audio signal, an amplifier voltage caused by playing back the first digital audio signal, a driver excursion caused by playing back the first digital audio signal, and a sound pressure caused by playing back the first digital audio signal.

Figure 2:
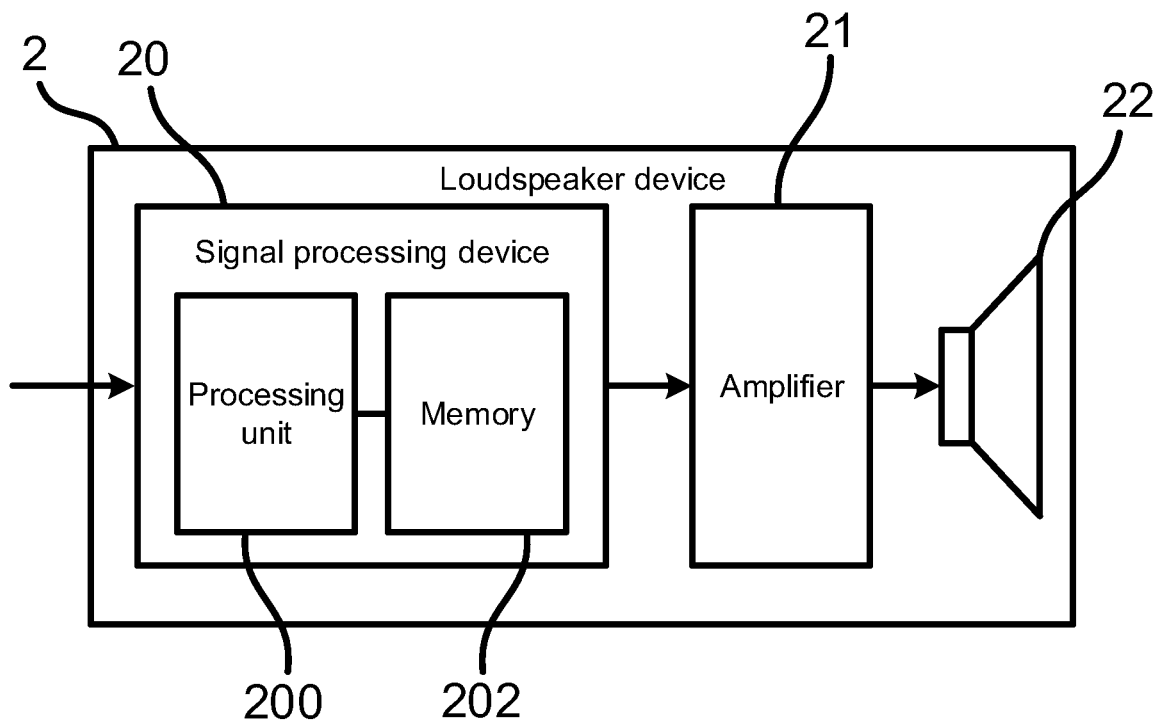
FIG. 2 shows a schematic block diagram of an embodiment of a loudspeaker device according to the present disclosure.

FIG. 2 shows a schematic block diagram of an embodiment of a loudspeaker device 2 according to the present disclosure.

The loudspeaker device 2 comprises a signal processing device 20, comprising a processing unit 200 and a memory 202 in operable connection with the processing unit 200. The loudspeaker device 2 further comprises an amplifier 21 and a loudspeaker driver 22.

In some embodiments, the loudspeaker device 2 may comprise a battery for providing a power supply to the signal processing device 2 and/or amplifier 21. Alternatively, or additionally, the loudspeaker device 2 may comprise a plurality of amplifiers and/or loudspeaker drivers.

The signal processing device 20 is configured to perform the method 1. Specifically, the signal processing device 20 receives the first digital audio data signal and outputs the third digital audio data signal to the amplifier 21, which then amplifies the signal for playback and provides the amplified signal to the loudspeaker driver 22.

Figure 3A:
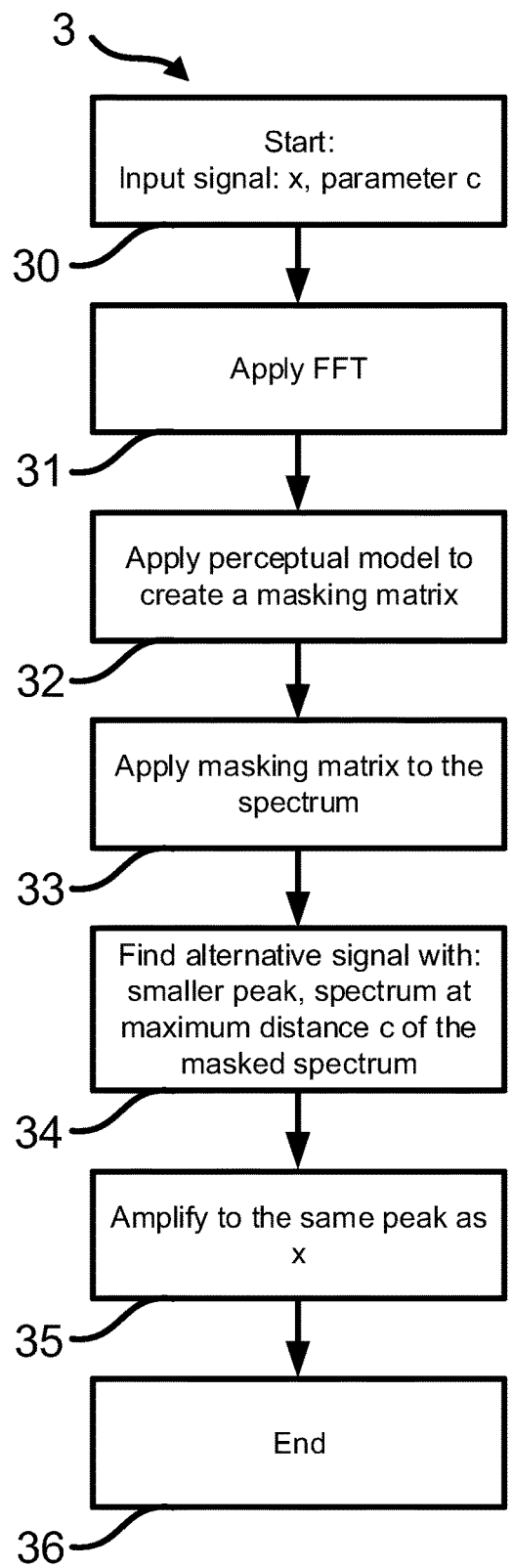
FIG. 3A shows an exemplary flow chart of an embodiment of a method according to the present disclosure.

FIG. 3A shows an exemplary flow chart of an embodiment of a method 3 according to the present disclosure. The method 3 may be implemented in and/or performed on a signal processing device, such as the signal processing device 20 illustrated in FIG. 2.

The method 3 starts at block 30, where an input signal x, i.e., a first digital audio data signal, and a perceptual constant parameter c is provided.

In step 31 a Fast Fourier Transform is applied to the input signal x to determine a spectrum of the input signal x. In step 32, a perceptual model is applied to the spectrum of the input signal x to create a masking matrix, which masking matrix is applied to the spectrum in step 33 to determine a masked spectrum.

In step 34, an alternative signal, i.e., a second digital audio data signal, to the input signal x is determined, the alternative signal having a smaller amplitude peak in the time domain and a spectrum at a maximum distance to the masked spectrum defined by the perceptual constant parameter c. The alternative signal is amplified in step 35 so that an amplitude peak thereof in the time domain has the same value as the amplitude peak of the input signal x. The method 3 ends in step 36. Step 36 may comprise outputting the amplified alternative signal, i.e., a third digital audio data signal.

Figure 3B:
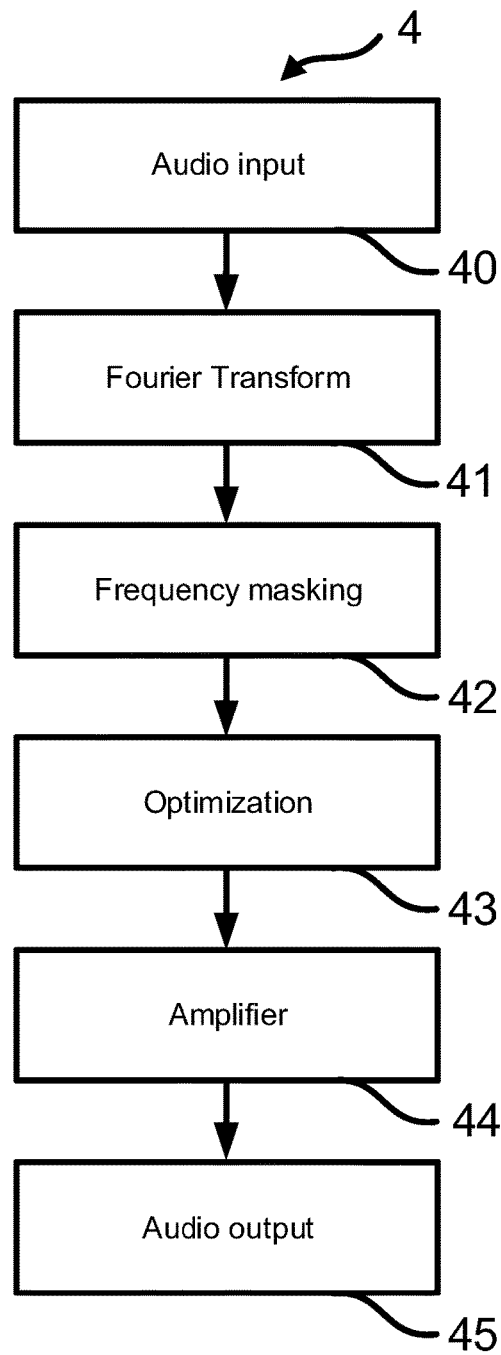
FIG. 3B shows an exemplary flow chart of an embodiment of a method according to the present disclosure.

FIG. 3B shows an exemplary flow chart of an embodiment of a method 4 according to the present disclosure.

In method 4, an audio input, a first digital audio signal, is provided in step 40. The first digital audio signal is Fourier transformed in step 41, and a frequency masking is determined in step 42 based on the Fourier transformed first digital audio signal and a predicted perceptual difference model. In step 43, an optimisation is performed to determine a second digital audio signal by reducing a temporal peak is in the first digital audio signal based on the determined frequency masking in step 42. In step 44, the second digital audio signal is amplified to generate a third digital audio signal, which is output in step 45.

Figure 4:
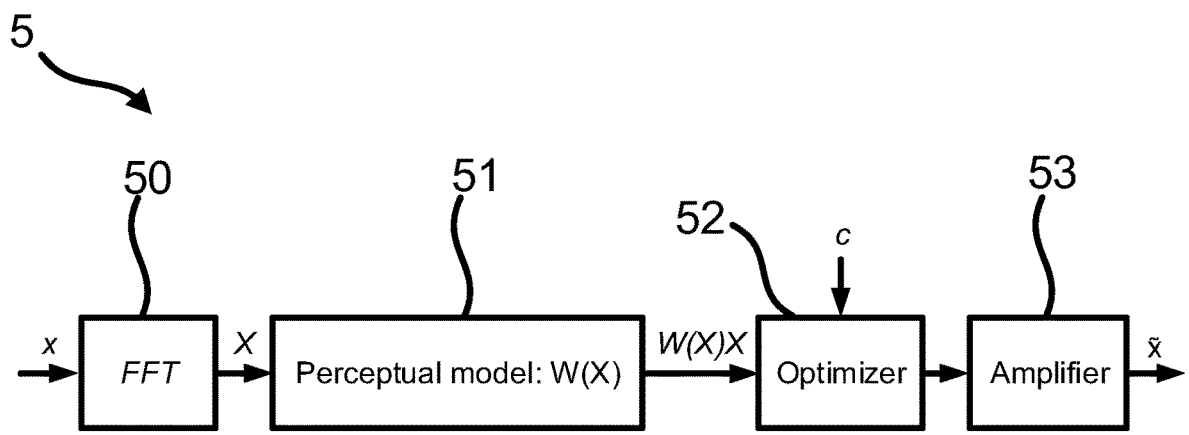
FIG. 4 shows an exemplary block diagram of an embodiment of a signal processing device according to the present disclosure.

FIG. 4 shows an exemplary block diagram of an embodiment of a signal processing device 5 according to the present disclosure. The signal processing device may be the signal processing device 20 illustrated in FIG. 2.

The signal processing device 5 comprises a Fourier transform block 50, taking as an input a digital audio signal x as a first digital audio data signal and outputting the spectrum thereof X. Fourier transform block 50 utilises a Fast Fourier Transform (FFT). In other embodiments, other types of discrete Fourier transforms may be used.

The signal processing device further comprises a perceptual model block 51. The perceptual model 51 determines a masking matrix W(X).

The signal processing device 5 further comprises an optimiser block 52 and an amplifier block 53. The masking matrix W(X) and the spectrum X is provided from the perceptual model block 51 to the optimiser block 52. The optimiser block 52 further obtains a perceptual constant c, which indicates a threshold for an acceptable perceptual difference between digital audio signal x and a peak reduced version of digital audio signal x as a second digital audio data signal. The optimiser block 52 determines a peak reduced version of digital audio signal x which based on the masking matrix W(X) has a predicted perceptual difference which is less than or equal to the perceptual constant c. The optimiser block 52 then outputs this peak reduced version to the amplifier block 53, which amplifies the peak-reduced version so that a peak of the peak-reduced version of the digital audio signal x has a same value as the (initial) peak of the digital audio signal x. The amplifier block 53 thereby generates and outputs a third digital audio data signal $\tilde{x}$.

An exemplary function of the block diagram of the signal processing device shown in FIG. 4 is described in the following.

Time signals and parameter are denoted by lower case letters. Frequency representation and matrices are denoted by upper case letters.

A signal x (an audio signal) and a parameter c are the inputs to the algorithm.

An alternative signal $\tilde{x}$ (an audio signal capable of giving higher loudness) is the output of the algorithm.

The signal x is transformed into X in the frequency domain using a Discrete Fourier Transform of length K (the frequency decomposition will be made over K frequencies). If x is long, it can be separated in different frames using a short-time Fourier transform or some time-frequency transforms.

A perceptual model is applied to create a diagonal masking matrix $W_X$ of dimension K×K. The masking matrix defines how perceptually important each frequency of the spectrum X is by assigning a weight to each. The masking matrix is dependent of the Fourier transform of x. If a frequency is not perceptually important it has a weight of 0 and if it is important, it has a big weight.

The masking matrix $W_X$ is given by a perceptual model modelling the way the ear and the brain filter and interpret sounds.

An alternative signal $\tilde{x}$ is found by running the following optimization problem:

minimize: $\max|\tilde{x}|$ such that: $\|W_X(\tilde{X}-X)\|_2^2 \leq c$     (3)

Where the norm of a vector is defined as:

$\|x\|_2 := \sqrt{x_1^2 + \ldots + x_n^2}$     (4)

The alternative signal is sought to have the smallest possible peak (written as the minimization of the max) under the constraint that the norm of the multiplication between the masking matrix $W_X$ and the difference between the two Fourier transforms of $\tilde{x}$ and x should be smaller than c. If the difference between the two spectrums is big in some irrelevant frequencies (where $W_X$ is 0) then it will not affect the norm in the constraint. On the contrary, if the difference between the two spectrums is small in some relevant frequencies (where $W_X$ is big) then it will contribute to a big part of the norm in the constraint.

In other words, suppose that X is almost the same as X but with some error $X_{err}$, it is possible to write $\tilde{X}=X+X_{err}$, $X_{err}=\tilde{X}-X$. Thus, the optimization problem consists of searching for a time signal R which has the smallest possible peak among all the time signals having a spectrum whose error $X_{err}$ is not perceptually important (meaning that the error will not be detectible by the human ear). This is ensured by having a perceptual error (which is equal to the norm of the multiplication between $W_X$ and $X_{err}$) smaller than a given parameter c. The parameter c defines how much perceptual difference is tolerated between the alternative signal $\tilde{x}$ and x. If c is 0 then both signals are identical, if c is too big then $\tilde{x}$ is composed of only 0s.

The alternative signal can then be amplified to have the same peak as x.

The crest factor (CF) is defined as the ratio between the peak value of a signal and its RMS (root mean square) and is a common metric to measure how big is the peak in a signal with respect to the energy of the signal. The goal in this work is to minimize this crest factor as much as possible. In mathematical terms, $$CF = \frac{\|x[n]\|_\infty}{\|x\|_{RMS}}.$$

If the peak decreases but the crest factor stays the same, it means that the volume was turned down. A square wave has the lowest possible crest factor, 1, while a pure spike (i.e., a delta function) has a bigger crest factor.

Figure 5:
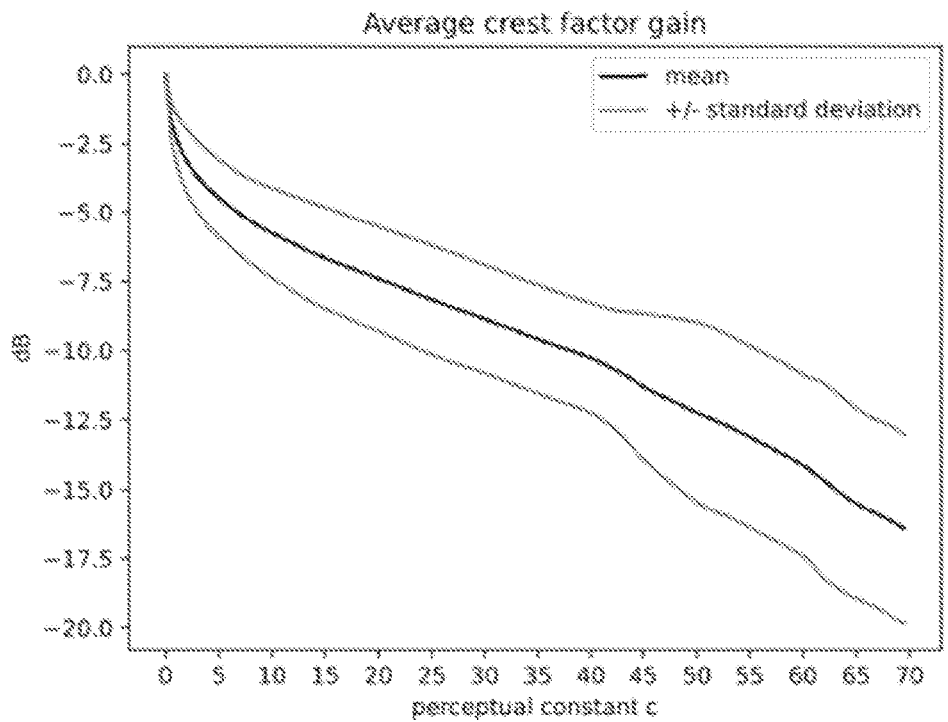
FIG. 5 shows an exemplary graph of an average crest factor gain as a function of a perceptual constant in an embodiment of a method according to the present disclosure.

As shown in FIG. 5, simulations on a dataset composed of kick drums are showing an interesting average decrease of the crest factor (plotted in dB), even for a small perceptual constant denoted by c. This means that it is possible to increase the loudness without compromising too much the audio quality.

The disclosure provided herein describes features in terms of preferred and exemplary embodiments thereof. Numerous other embodiments, modifications and variations within the scope and spirit of the appended claims will occur to persons of ordinary skill in the art from a review of this disclosure.

The invention claimed is:

1. A method for increasing a perceived loudness of an audio data signal comprising the steps of:

obtaining a first digital audio data signal;

determining at least one temporal amplitude peak in the first digital audio data signal;

generating a second digital audio data signal by reducing the at least one temporal amplitude peak in the first digital audio data signal based on a predicted perceptual difference model representing a predicted perceptual difference between the first digital audio data signal and a peak reduced version of the first digital audio data signal; and generating a third digital audio data signal by amplifying the second digital audio data signal so that a peak of the second digital audio data signal has a predetermined signal value, wherein a perceived loudness of the third digital audio data signal is larger than a perceived loudness of the first digital audio data signal.

2. The method according to claim 1, wherein the first digital audio data signal comprises one or more of a digital audio signal, a digital signal representative of an acoustic driver current, a digital signal representative of an acoustic driver voltage, a digital signal representative of an excursion of an acoustic driver, and a digital signal representative of a sound pressure when the digital signal is played back via an acoustic driver.

3. The method according to claim 1, wherein the step of generating the second digital audio data signal based on the predicted perceptual difference model comprises reducing the at least one temporal amplitude peak of the first digital audio data signal so that the predicted perceptual difference between the first digital audio data signal and the peak reduced version of the first digital audio data signal is less than or equal to a predetermined threshold value.

4. The method according to claim 1, wherein:

the step of generating the second digital audio data signal based on the predicted perceptual difference model comprises selecting a peak reduced version of the first digital audio data signal from a plurality of peak reduced versions of the first digital audio data signal based on the predicted perceptual difference between the first digital audio data signal and each of the peak reduced versions of the first digital audio data signal; and the at least one temporal amplitude peak of each of the plurality of peak reduced versions of the first digital audio data signal has been reduced to be less than or equal to a predetermined signal threshold value.

5. The method according to claim 1, wherein:

the predicted perceptual difference model comprises a masking model representative of a perceptual weight of frequencies in an audio data signal; and the method further comprises obtaining the masking model.

6. The method according to claim 5, wherein the masking model comprises a masking matrix.

7. The method according to claim 5, further comprising the step of obtaining the masking model by determining the masking model based on the first digital audio data signal.

8. The method according to claim 5, wherein the second digital audio data signal is generated based on a peak reduced version of the first digital audio data signal so that a weighted spectral difference between the first digital audio data signal and the peak reduced version of the first digital audio data signal is less than or equal to a predetermined threshold value.

9. The method according to claim 1, wherein the second digital audio data signal is generated by minimising the at least one temporal peak in the first digital audio data signal based on the predicted perceptual difference between the peak reduced version of the first digital audio data signal and the first digital audio data signal being less than or equal to a predetermined threshold value.

10. The method according to claim 1, wherein:
the first digital audio data signal is sampled by a first sampling rate; and
the method further comprises, after receiving the first digital audio data signal and prior to generating the second digital audio data signal, down-sampling the first digital audio data signal by a second sampling rate, the second sampling rate being lower than the first sampling rate.

11. The method according to claim 1, wherein the method further comprises outputting the third digital audio data signal to an audio pre-amplifier, an audio power-amplifier, or a cross-over network.

12. The method according to claim 1, further comprising, prior to determining the at least one temporal amplitude peak in the first digital audio data signal and generating the second digital audio data signal, applying a low-pass and/or band-pass filter to the first digital audio data signal.

13. The method according to claim 12, wherein:
the applying a band-pass filter comprises applying a filter-bank comprising a plurality of bandpass filters to the first digital audio data signal to generate a plurality of band-pass filtered versions of the first digital audio data signal;
the at least one temporal amplitude peak(s) is/are determined in one or more of the plurality of band-pass filtered versions of the first digital audio data signal; and
the second digital audio data signal is generated by reducing a peak in the one or more of the plurality of band-pass filtered versions of the first digital audio data signal.

14. A loudspeaker device comprising a signal processing device configured to perform the method according to claim 1, wherein:
the loudspeaker device further comprises a loudspeaker driver and an amplification arrangement connected to the loudspeaker driver and the signal processing device, the amplification arrangement being configured to provide an audio signal to the loudspeaker driver; and
the signal processing device is configured to output the second digital audio data signal to the amplification arrangement.

15. The loudspeaker device according to claim 14, wherein the loudspeaker device further comprises a battery for powering at least the signal processing device and the amplification arrangement.

16. A computer program product comprising program code means adapted to cause a data processing system to perform the steps of the method according to claim 1, when the program code means are executed on the data processing system.

17. The computer program product according to claim 16, wherein the computer program product comprises a non-transitory computer-readable medium having stored thereon the program code means.

18. A non-transitory computer-readable storage media comprising computer-executable instructions, which when executed by at least one processor, cause the at least one processor to:
obtain a first digital audio data signal;
determine at least one temporal amplitude peak in the first digital audio data signal;
generate a second digital audio data signal by reducing the at least one temporal amplitude peak in the first digital audio data signal based on a predicted perceptual difference model representing a predicted perceptual difference between the first digital audio data signal and a peak reduced version of the first digital audio data signal; and
generate a third digital audio data signal by amplifying the second digital audio data signal so that a peak of the second digital audio data signal has a predetermined signal value, wherein a perceived loudness of the third digital audio data signal is larger than a perceived loudness of the first digital audio data signal.

19. A loudspeaker device comprising a signal processing device configured to:
obtain a first digital audio data signal;
determine at least one temporal amplitude peak in the first digital audio data signal;
generate a second digital audio data signal by reducing the at least one temporal amplitude peak in the first digital audio data signal based on a predicted perceptual difference model representing a predicted perceptual difference between the first digital audio data signal and a peak reduced version of the first digital audio data signal; and
generate a third digital audio data signal by amplifying the second digital audio data signal so that a peak of the second digital audio data signal has a predetermined signal value, wherein a perceived loudness of the third digital audio data signal is larger than a perceived loudness of the first digital audio data signal;
wherein:
the loudspeaker device further comprises a loudspeaker driver and an amplification arrangement connected to the loudspeaker driver and the signal processing device, the amplification arrangement being configured to provide an audio signal to the loudspeaker driver; and
the signal processing device is configured to output the second digital audio data signal to the amplification arrangement.

20. The loudspeaker device according to claim 19, wherein the loudspeaker device further comprises a battery for powering at least the signal processing device and the amplification arrangement.

* * * * *